(12) United States Patent
Fischer et al.

(10) Patent No.: US 7,750,350 B2
(45) Date of Patent: Jul. 6, 2010

(54) ORGANIC THIN FILM TRANSISTOR, FLAT PANEL DISPLAY APPARATUS HAVING THE SAME, METHOD OF PRODUCING THE ORGANIC THIN FILM TRANSISTOR AND SHADOW MASK USED IN THE METHOD

(75) Inventors: Joerg Fischer, Berlin (DE); Arthur Mathea, Berlin (DE); Mario Breithecker, Berlin (DE)

(73) Assignee: Samsung Mobile Display Co., Ltd., Yongin (KR)

( * ) Notice: Subject to any disclaimer, the term of this patent is extended or adjusted under 35 U.S.C. 154(b) by 527 days.

(21) Appl. No.: 11/380,249

(22) Filed: Apr. 26, 2006

(65) Prior Publication Data

US 2006/0267002 A1 Nov. 30, 2006

(30) Foreign Application Priority Data

May 25, 2005 (EP) .................................. 05104440
Aug. 31, 2005 (KR) ...................... 10-2005-0080650

(51) Int. Cl.
*H01L 27/14* (2006.01)
*H01L 29/04* (2006.01)
*H01L 29/15* (2006.01)
*H01L 31/036* (2006.01)

(52) U.S. Cl. ............................. 257/72; 257/59; 257/66; 257/40

(58) Field of Classification Search ................... 257/40, 257/59, 72

See application file for complete search history.

(56) References Cited

U.S. PATENT DOCUMENTS

| 5,185,601 | A | * | 2/1993 | Takeda et al. ................... 349/39 |
| 5,784,131 | A | * | 7/1998 | Kim et al. ....................... 349/39 |
| 6,403,392 | B1 | | 6/2002 | Burrows et al. |
| 2003/0059975 | A1 | * | 3/2003 | Sirringhaus et al. ........... 438/99 |
| 2004/0141113 | A1 | | 7/2004 | Yun |
| 2004/0196419 | A1 | * | 10/2004 | Kanou et al. ................. 349/113 |

OTHER PUBLICATIONS

Plotner, M., et al. "Investigation of ink-jet printing of poly-3-octylthiophene for organic field-effect transistors from different solutions", Synthetic Metals, Elsevier Sequoia, Lausanne, CH, vol. 147, No. 1-3, Dec. 7, 2004, pp. 299-303.
European Search Report, issued Nov. 10, 2005.

* cited by examiner

*Primary Examiner*—Kenneth A Parker
*Assistant Examiner*—Anthony Ho
(74) *Attorney, Agent, or Firm*—H.C. Park & Associates, PLC

(57) ABSTRACT

An organic thin film transistor with circular semiconducting elements applied to the substrate in a plurality of hexagonal patterns, a method of producing the same, and a shadow mask used in the method that allows for formation of the organic thin film transistor without need for precise alignment of the shadow mask on the substrate. The substrate has a plurality of thin film transistors, each having a drain electrode, a source electrode, a gate electrode, and a channel formed of semiconducting elements that, due to relative dimensions and alignments of the semiconducting elements, may connect both the drain electrode and the source electrode of one transistor but not two electrodes of adjacent transistors. The shadow mask includes openings in the hexagonal pattern, and the pattern is rotated at an angle of 15° relative to longitudinal axes of the drain and source electrodes to form channels.

22 Claims, 17 Drawing Sheets

ORGANIC THIN FILM TRANSISTOR, FLAT PANEL DISPLAY APPARATUS HAVING THE SAME, METHOD OF PRODUCING THE ORGANIC THIN FILM TRANSISTOR AND SHADOW MASK USED IN THE METHOD

CROSS REFERENCE TO RELATED APPLICATIONS

This application claims priority to and the benefit of European Patent Application No. 05104440.2, filed on May 25, 2005, and Korean Patent Application No. 10-2005-0080650, filed on Aug. 31, 2005, which are hereby incorporated by reference for all purposes as if fully set forth herein.

BACKGROUND OF THE INVENTION

1. Field of the Invention

The present invention relates to an organic thin film transistor, a method of producing the same, and a shadow mask used in the method, and more particularly, to a plurality of organic thin film transistors disposed on a substrate in a matrix-shape to make an active matrix display, a method of producing the same, and a shadow mask used in the method.

2. Discussion of the Background

An organic thin film transistor (OTFT) includes an organic material, which acts as a channel between a source electrode and a drain electrode, whereby the conductivity of the organic material is controlled by a gate electrode of the OTFT.

In several applications, such as in an Active Matrix Display, a plurality of OTFTs are arranged in a series of vertical and horizontal lines, thereby forming a matrix. When manufacturing OTFTs arranged in a matrix, the OTFTs are structured by depositing an array of semiconductor areas, which act as channels and which overlap the drain electrodes and source electrodes. The organic semiconductor material is deposited onto the OTFT substrate, which already includes the drain electrodes and source electrodes, by using thermal evaporation of organic semiconductor materials through a shadow mask or by using solution based processes for semiconductor materials, like printing techniques such as inkjet printing, a printing process sold under the trademark Flexo®, doctor blade coating, or other technologies.

The patterning of the semiconductor layer is essential for achieving a good single transistor performance, such as a high ON/OFF current ratio. The patterning is also required to prevent unwanted cross-talk effects between adjacent TFTs and conductive lines in an electronic circuit. The non-patterned semiconductor element can cause a current leakage path. Therefore, the semiconductor element has to be deposited only in the channel area of a single transistor where no contact with the channel area of adjacent TFTs shall occur.

WO 03/098696 A1 (Seiko Epson) describes the fabrication of circuit inter-connections in thin film circuits involving the use of a lithographic technique to provide patterned layer and depositing first material at localized regions using inkjet printing technique.

EP 1 139 455 A2 (Seiko Epson) describes a method of manufacturing an organic electroluminescent (EL) element. A special patterning is required to create an opening corresponding to the region for the formation of a constitutive layer.

US 2003/0059975 A1 and WO 01/46987 A2 (Plastic Logic) describe a method of forming at least one part of an integrated circuit by ink-jet printing.

WO 03/056641 A1 (Plastic Logic) describes a method of forming an organic or partly organic switching device. The method includes depositing layers of conducting, semiconducting and/or insulating layers by solution processing and direct printing, and defining high-resolution patterns of electro-active polymers by self-aligned formation of a surface energy barrier around a first pattern that repels the solution of a second material.

DE 100 61 297 A1 (Siemens) describes an organic field-effect transistor (OFET), a method of structuring an OFET, and an integrated circuit with improved structuring of the functional polymer layers. The improved structuring is obtained by introducing, using a doctor blade, a functional polymer in a mold layer into which recesses are initially produced through an additional fabrication step, such as imprinting.

U.S. Pat. No. 5,946,551 (Dimitrakopoulos et al.) describes the fabrication of TFTs with organic semiconductors, where shadow mask techniques are used to define source/drain metal electrodes.

U.S. Pat. No. 6,667,215 B2 (3M) describes a method of manufacturing transistors by using stationary shadow masks to define source and drain electrodes.

U.S. Pat. No. 6,384,529 B2 (Kodak) describes a color active matrix organic electro-luminescent display with an integrated shadow mask. The shadow masks are used to define the color conversion layers or the emissive RGB sub pixels.

U.S. Pat. No. 5,742,129 (Pioneer) describes a method of manufacturing an organic EL display panel having a plurality of emitting portions surrounded by ramparts and arranged as a matrix. In the method, the shadow mask is used to deposit the media. However, there is a repeated putting and aligning step required to deposit the media through the openings of the shadow mask.

Therefore, all techniques for the deposition of the semiconductor known in the state of the art require a very precise alignment procedure. Where a shadow mask technique is used, the shadow mask must be very precisely aligned with the substrate. With a photolithographic patterned semiconductor, the photomask has to be precisely aligned as well. Also, all printing techniques for the deposition of the semiconductor known in the state of the art require a very precise alignment procedure between a printing device and a substrate to be printed. Additionally, printing processes for flexible substrates require cost-intensive local registration during the printing process due to a possible shrinkage or deflection of the substrate.

FIG. 1 shows a sectional view of a bottom gate OTFT which can be used, for example, in an active matrix OLED. The OTFT includes a gate electrode 4, which is disposed on a substrate 5, an insulator 3, a source electrode 2 and a drain electrode 2a, whereby a semiconducting element 1 is disposed between the source electrode 2 and the drain electrode 2a, thereby forming a semiconducting channel 11.

FIG. 2 shows a sectional view of a top gate OTFT which can be used, for example, in an active matrix OLED. The OTFT comprises a source electrode 2 and a drain electrode 2a, which are disposed on a substrate 5, whereby semiconducting element 1 is disposed between the source electrode 2 and the drain electrode 2a, thereby forming a semiconducting channel 11. An insulator 3 and a gate electrode 4 are disposed upon the electrodes 2 and 2a and the channel 11.

FIG. 3A and FIG. 4A show the basic principle of the deposition of organic semiconductor element 1 through a shadow mask 13 for the manufacture of a bottom (shown in FIG. 3A) or a top (shown in FIG. 4A) gate OTFT. An evaporation stream 8 is controlled by the openings in the shadow mask 13, thereby resulting in a deposition of a semiconductor element 1 at a predetermined area between the source electrode 2 and the drain electrode 2*a*. A continuous deposition of the semiconductor element 1 is not possible because connections between adjacent TFTs are generally avoided. Therefore high alignment tolerances for the position of the shadow mask 13 in relation to the substrate 5 exist in order to deposit the semiconductor element 1 substantially between only the source electrode 2 and drain electrode 2*a*.

FIG. 3B and FIG. 4B show the basic principle of the deposition of organic semiconductor element 1 by inkjet printing for the manufacture of a bottom (shown in FIG. 3B) or a top (shown in FIG. 4B) gate OTFT in a sectional view. The application of semiconductor ink droplets 15 is controlled by a print head 14, thereby resulting in a deposition of semiconductor element 1 at a predetermined area between the source electrode 2 and the drain electrode 2*a*. A continuous deposition of semiconductor element 1 is not possible because connections between adjacent TFTs are generally avoided. Therefore high alignment tolerances for the position of the print head 14 in relation to the substrate 5 exist to deposit the semiconductor element 1 substantially between only the source electrode 2 and the drain electrode 2*a*.

FIG. 5 shows a top view of a conventional organic TFT architecture including the source electrode 2 and the drain electrode 2*a* formed on the insulator 3, and the semiconductor channel 11 connecting the source electrode 2 and the drain electrode 2*a*. The openings of a shadow mask (not shown) have to be precisely positioned over the gaps between the source electrodes 2 and the drain electrodes 2*a* for the deposition of the semiconductor element 1. The precision is usually in the sub-mm range and, for active matrix OLED with high resolution, in the µm range. The channel 11 to be filled with the semiconductor element 1 comprises a channel Length 16 (L) of the transistor, which approximately equals the distance between the drain and source electrodes, and a channel Width 17 (W) of the transistor.

SUMMARY OF THE INVENTION

This invention provides a substrate having a plurality of Organic Thin Film Transistors (OTFTs) which can be manufactured by simpler manufacturing techniques in comparison to conventional organic TFT devices.

The present invention also provides a method of producing OTFTs arranged on a substrate in a matrix or in a circuit with fewer steps.

The present invention also provides an apparatus for manufacturing a plurality of OTFTs arranged on a substrate at a lower price.

Additional features of the invention will be set forth in the description which follows, and in part will be apparent from the description, or may be learned by practice of the invention.

The present invention discloses a substrate having a plurality of pairs of drain electrodes and source electrodes for thin film transistors, and a plurality of semiconducting elements arranged in a pattern. Further, a first distance between a drain electrode and a source electrode of one pair is smaller than a second distance which is a minimal distance between one electrode of the one pair and one electrode of an adjacent pair or which is a distance between a drain electrode or a source electrode of one pair and a conductive line of the substrate, and where the maximum dimension of a semiconducting element is smaller than the second distance and equal to or greater than the first distance.

The present invention also discloses a substrate having a plurality of thin film transistors. Each thin film transistor has a drain electrode, a source electrode positioned a predetermined first distance from the drain electrode, a channel positioned between the drain electrode and the source electrode and formed by a plurality of semiconducting elements arranged in a regular pattern, and a gate electrode. Further, wherein the first distance is smaller than a second distance which is a minimal distance between one electrode of one thin film transistor and one electrode of an adjacent thin film transistor or which is a distance between the drain electrode or the source electrode of one thin film transistor and a conductive line of the substrate, and a maximum dimension of a semiconducting element is less than the second distance but equal to or greater than the first distance.

The present invention also discloses a method of producing a substrate with a plurality of thin film transistors, where the method includes forming a plurality of pairs of drain electrodes and source electrodes on the substrate with a first minimum distance between a drain electrode and a source electrode of one pair that is less than a second distance which is a minimal distance between one electrode of the one pair and one electrode of an adjacent pair or which is a distance between a drain electrode or a source electrode of one pair and a conductive line of the substrate, and forming a channel between a drain electrode and a source electrode by applying a regular pattern of a plurality of semiconducting elements. Further, a maximum dimension of a semiconducting element is less than the second minimum distance but greater than or equal to the first minimum distance.

The present invention also discloses a flat panel display apparatus, including a substrate with a plurality of pairs of drain electrodes and source electrodes for thin film transistors and a plurality of semiconducting elements arranged in a pattern, and a display element electrically coupled with at least one pair of a drain electrode and a source electrode on the substrate. Further, a first distance between a drain electrode and a source electrode of one pair is smaller than a second distance between two electrodes of adjacent pairs or between a drain electrode or source electrode and a conductive line of the substrate, and where the maximum dimension of a semiconducting element is smaller than the second distance and equal to or greater than the first distance.

The present invention also discloses a flat panel display apparatus, including a substrate with a plurality of thin film transistors. Each thin film transistor has a drain electrode, a source electrode positioned a predetermined first distance from the drain electrode, a channel positioned between the drain electrode and the source electrode and formed by a plurality of semiconducting elements arranged in a regular pattern, and a gate electrode. The substrate also has a display element electrically coupled with at least one pair of a drain electrode and a source electrode on the substrate. Further, the first distance is smaller than a second distance between two electrodes of adjacent transistors or between the drain electrode or the source electrode and a conductive line of the substrate, and a maximum dimension of a semiconducting element is less than the second distance but equal to or greater than the first distance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
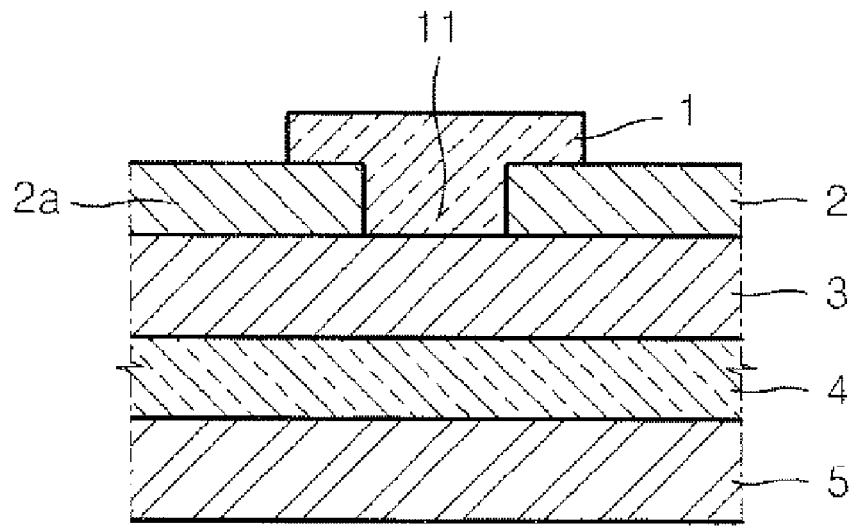
FIG. 1 shows a sectional view of a bottom gate Organic Thin Film Transistor (OTFT).
Figure 2:
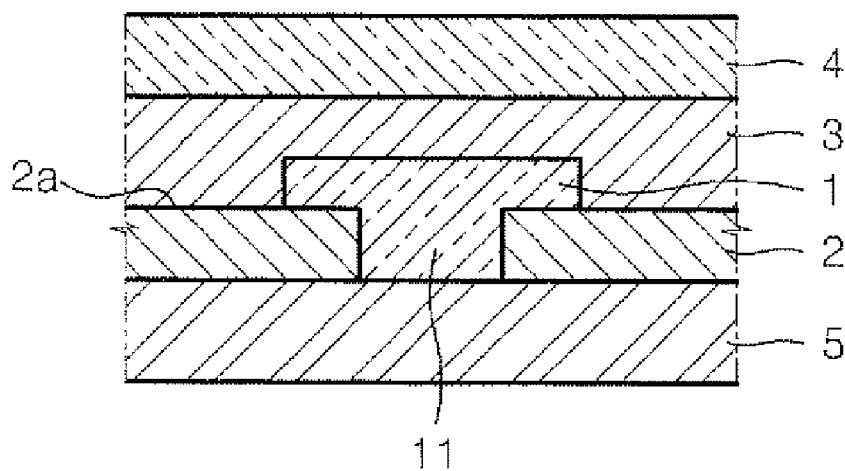
FIG. 2 shows a sectional view of a top gate OTFT.
Figure 3A:
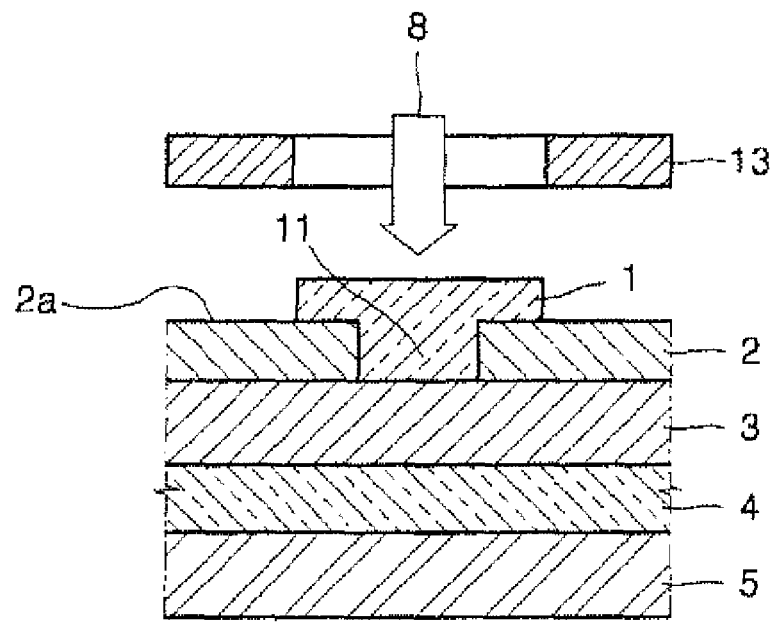
FIG. 3A shows a sectional view of the basic principle of the deposition of organic semiconductor element through a shadow mask for the manufacture of a bottom gate OTFT.
Figure 3B:
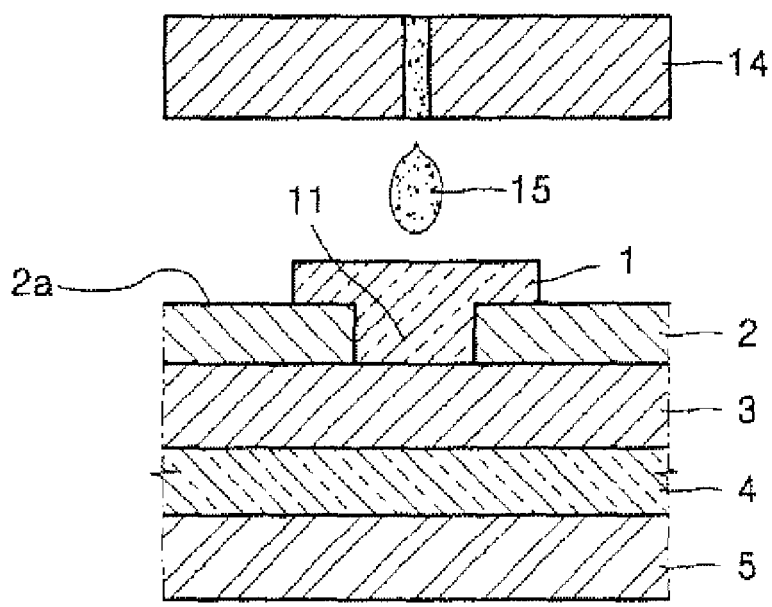
FIG. 3B shows a sectional view of the basic principle of the deposition of organic semiconductor element by inkjet printing for the manufacture of a bottom gate OTFT.
Figure 4A:
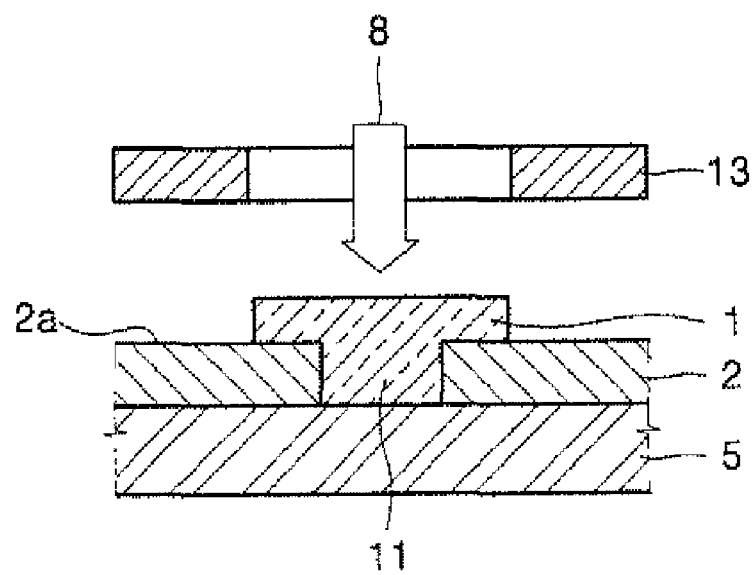
FIG. 4A shows a sectional view of the basic principle of the deposition of organic semiconductor element through a shadow mask for the manufacture of a top gate OTFT.
Figure 4B:
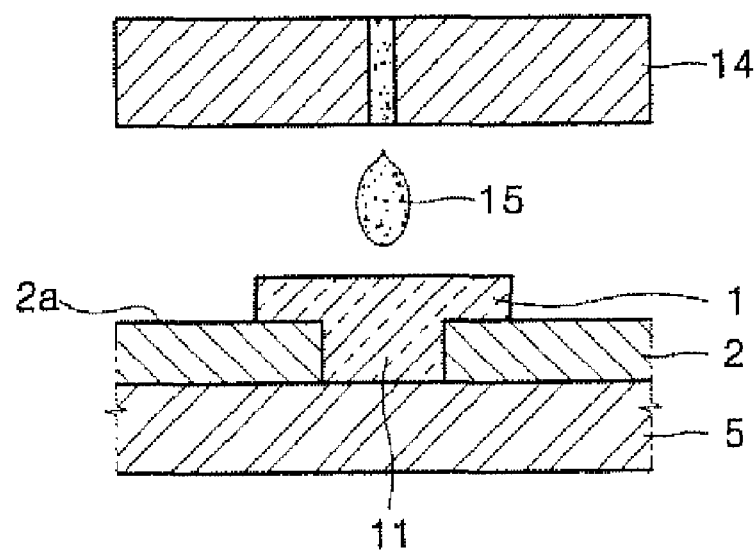
FIG. 4B shows a sectional view of the basic principle of the deposition of organic semiconductor element by inkjet printing for the manufacture of a top gate OTFT.
Figure 5:
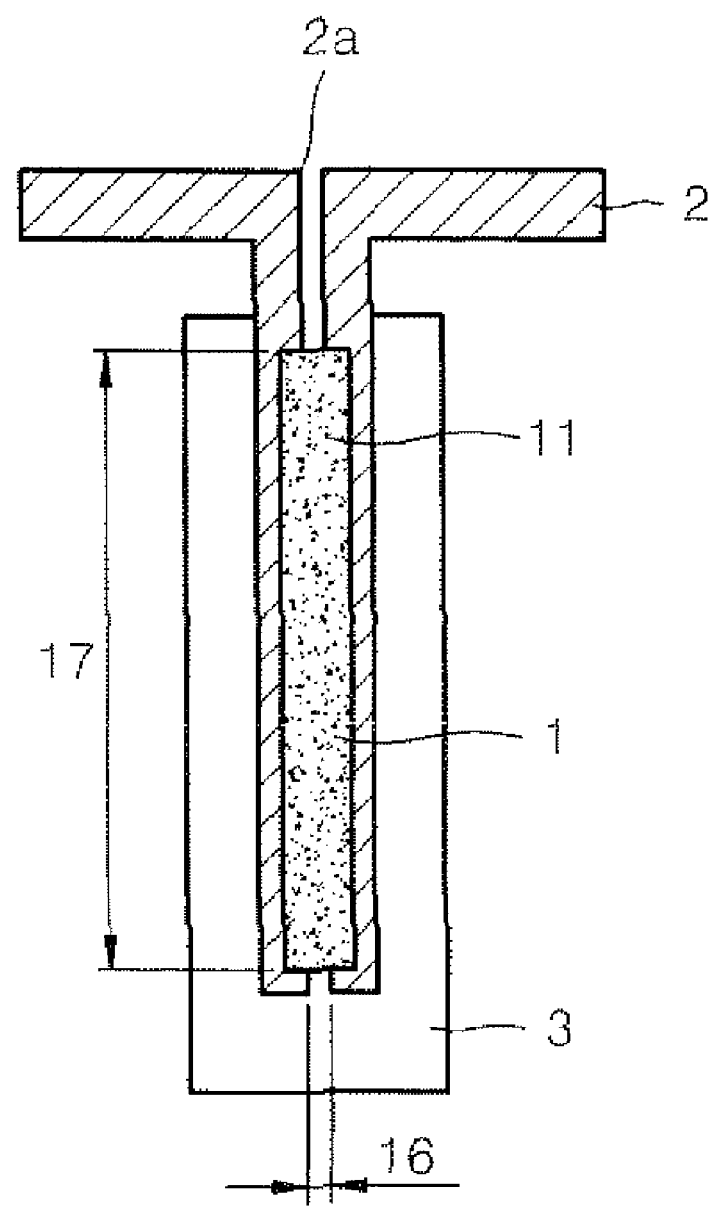
FIG. 5 shows a top view of a conventional organic TFT architecture with a patterned semiconductor.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 6A:
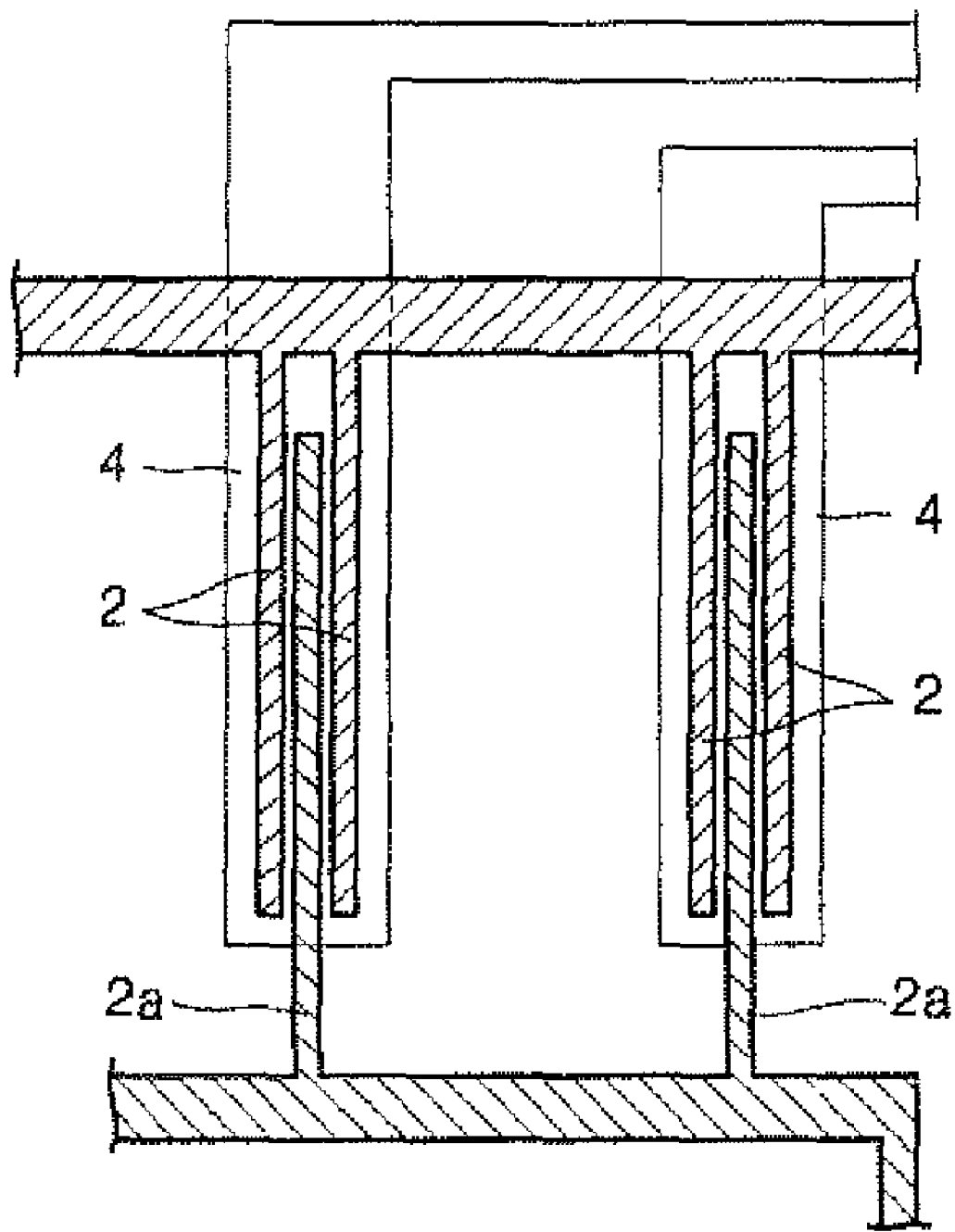
FIG. 6A shows a top view of a section of a substrate comprising a plurality of TFTs having source, drain, and gate electrodes prior to the application of the semiconducting element (channel).
Figure 6B:
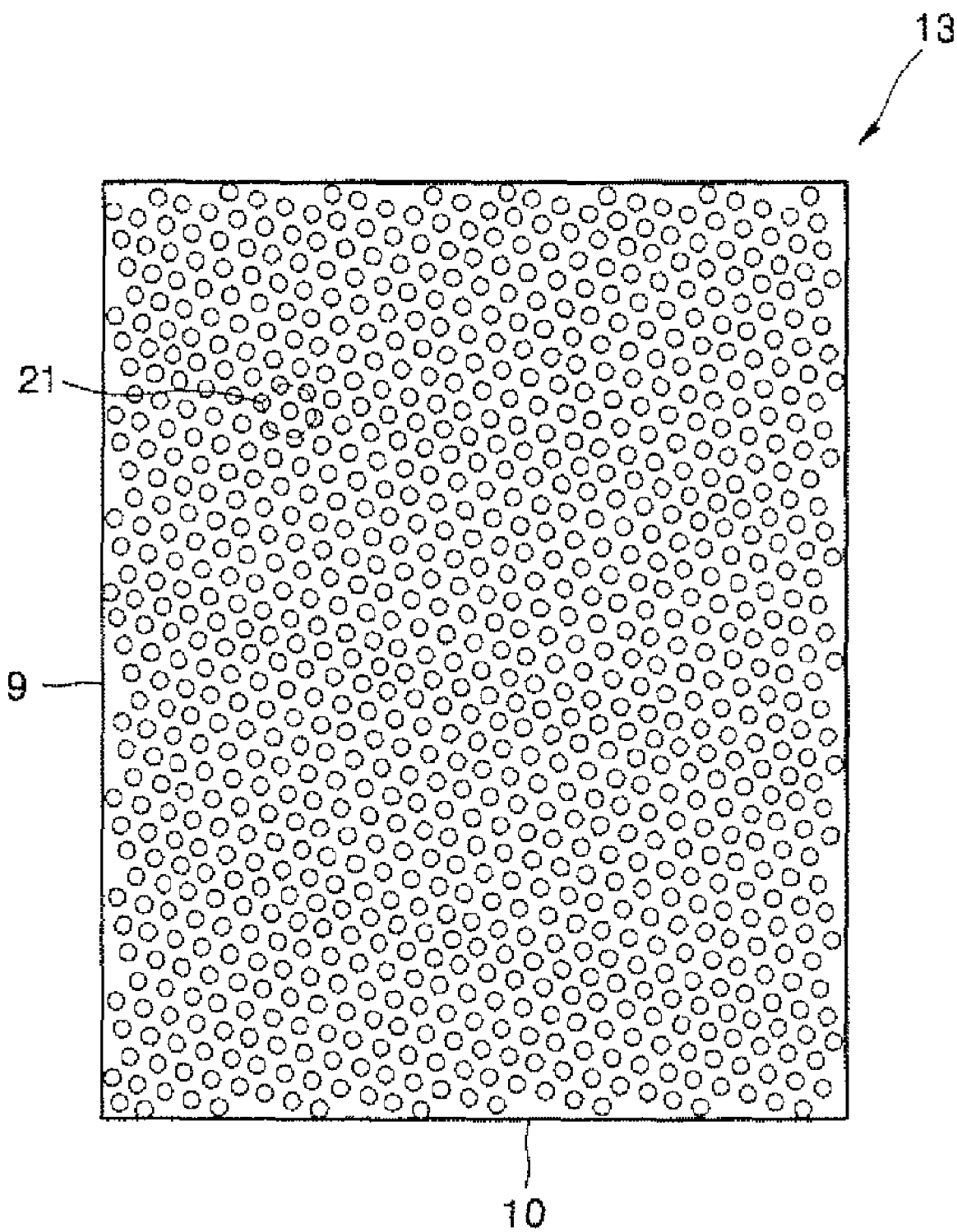
FIG. 6B shows the shadow mask used for the application of the semiconducting element (channel) according to an embodiment of the present invention.
Figure 6C:
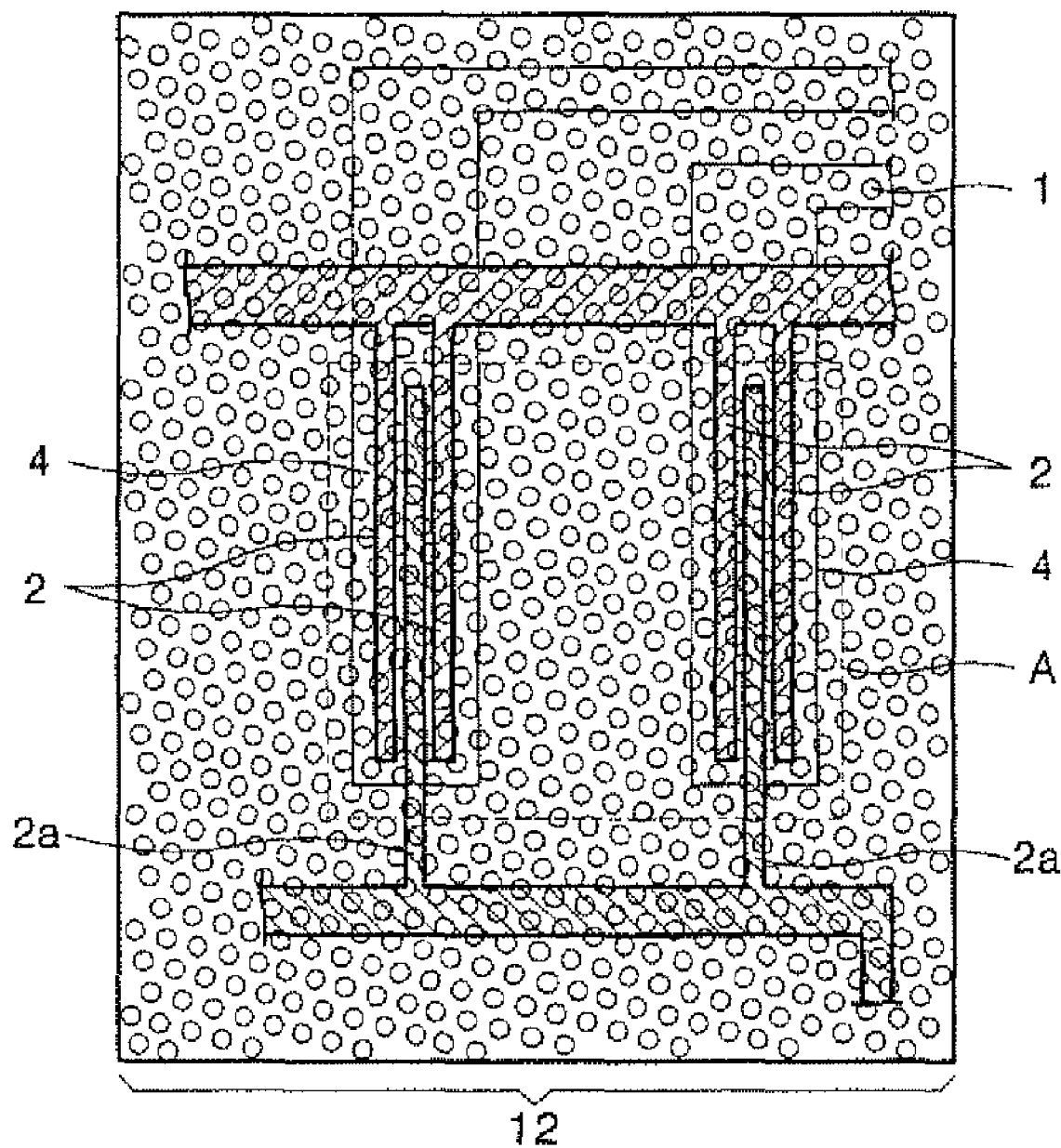
FIG. 6C shows a top view of a section of a substrate comprising a plurality of TFTs having source, drain, and gate electrodes after the application of the semiconducting element (channel).
Figure 6D:
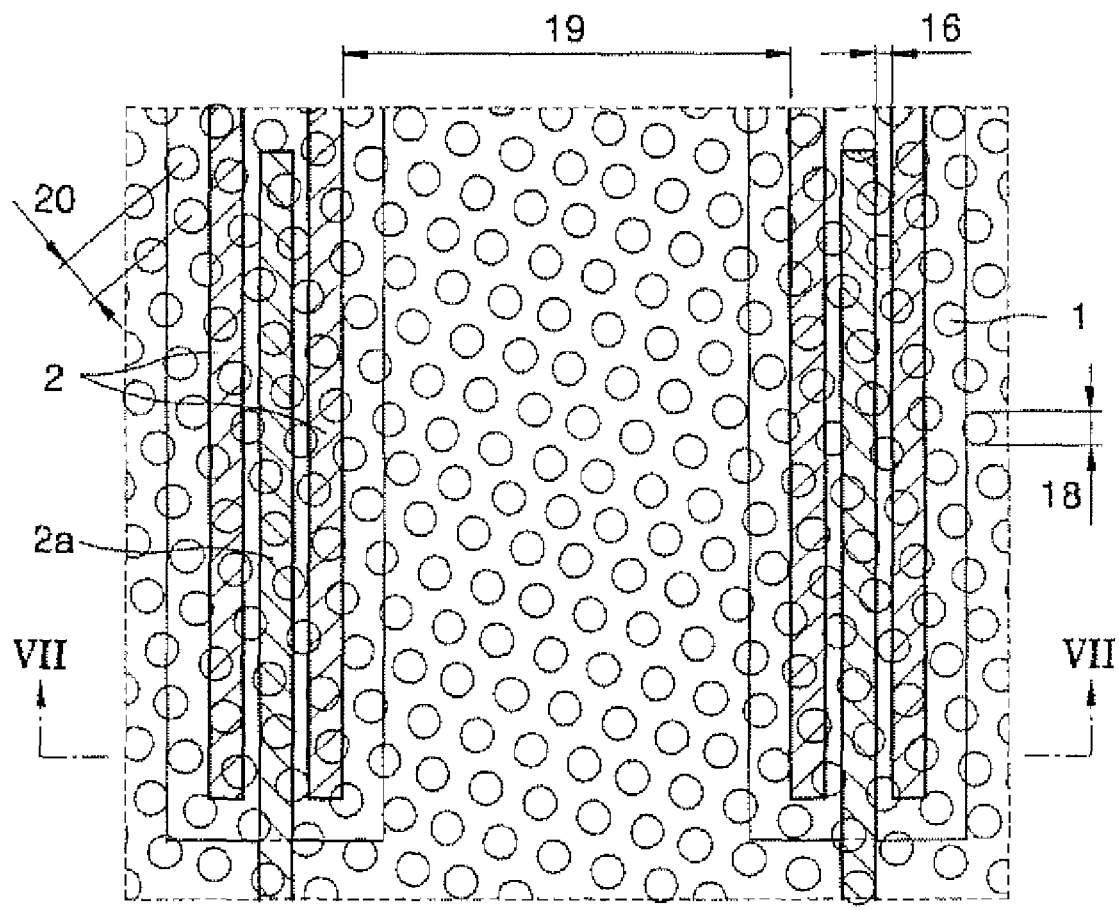
FIG. 6D shows an enlarged view of a section of FIG. 6C.
Figure 12:
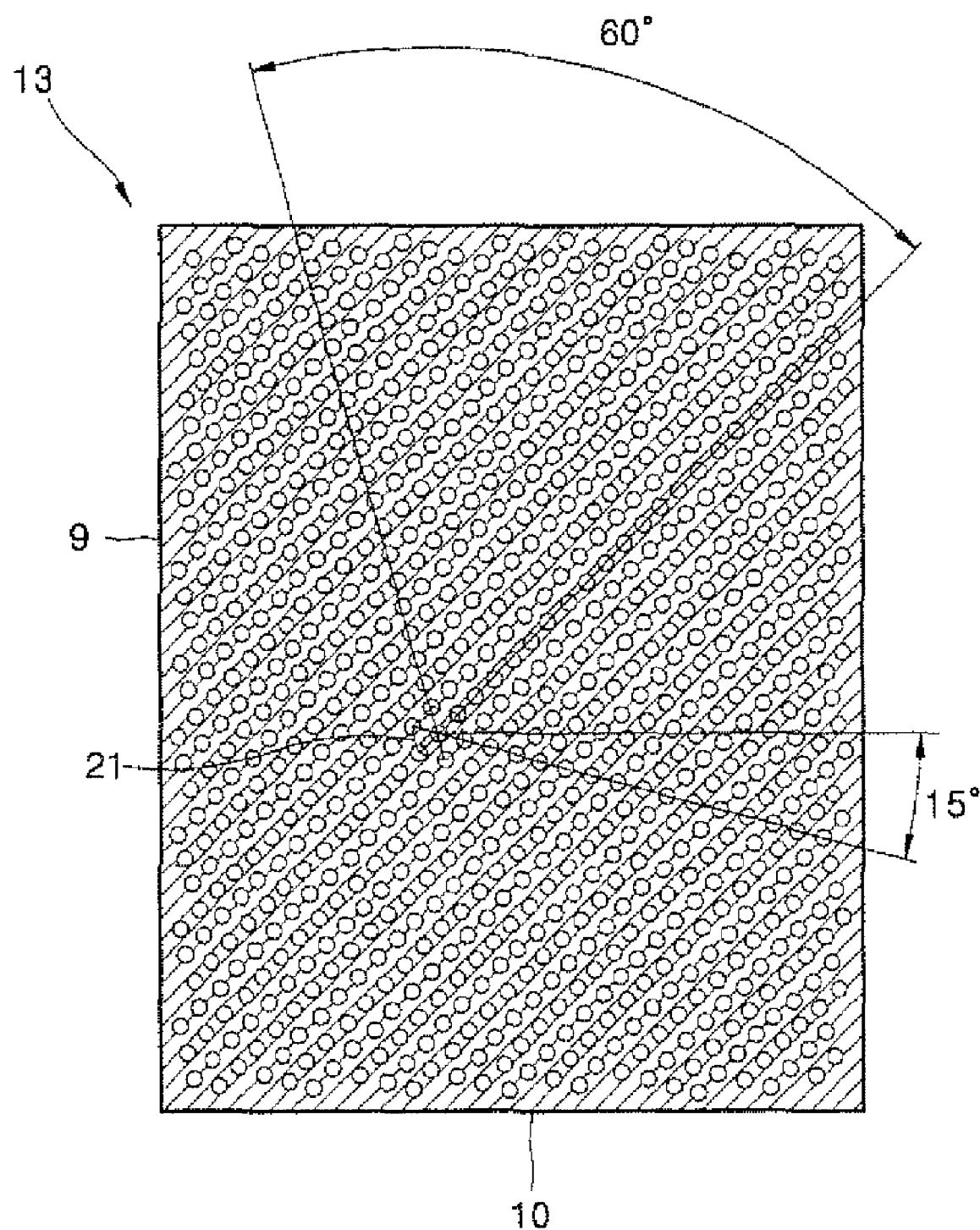
FIG. 12 shows a top view of the shadow mask used for the application of the semiconducting element (channel) according to an embodiment of the present invention.

FIG. 6A shows a top view of a section of a substrate 5 (not shown) comprising two TFTs having source electrodes 2, drain electrodes 2a, and gate electrodes 4 prior to the application of a semiconducting element 1 (semiconducting element 1 and channel 11 are not shown). Referring to FIG. 6D, showing an enlarged view of section A of FIG. 6C, a minimal distance 16 between the drain electrode 2a and the source electrode 2 of one pair is smaller than a minimal distance 19 between the electrodes 2 and 2a of adjacent pairs or between the electrodes 2 and 2a and other conductive lines (not shown) of the substrate 5. FIG. 6B shows a shadow mask 13 used for the application of the semiconducting element 1 and channel 11 (not shown). The shadow mask 13 comprises a hexagon-shaped pattern 21 and edges 9 and 10 wherein the hexagons 21 are tilted by 15° in respect to the longitudinal axis of the edge 10. The tilt of hexagons 21 is shown in more detail in FIG. 12. The hexagons 21 are made by connecting centers of six openings formed in the shadow mask 13 as illustrated in FIG. 6B. The semiconducting elements 1, shown in FIG. 6C and FIG. 6D, are formed using the shadow mask 13 and arranged in a hexagon-shaped pattern as well such that the hexagons 21 are tilted 15° with respect to the longitudinal axes of drain electrodes and source electrodes. The hexagon-shape arrangement of the pattern leads to a very homogeneous distribution of the semiconducting elements 1 for all horizontal and vertical lines of the substrate.

Figure 13:
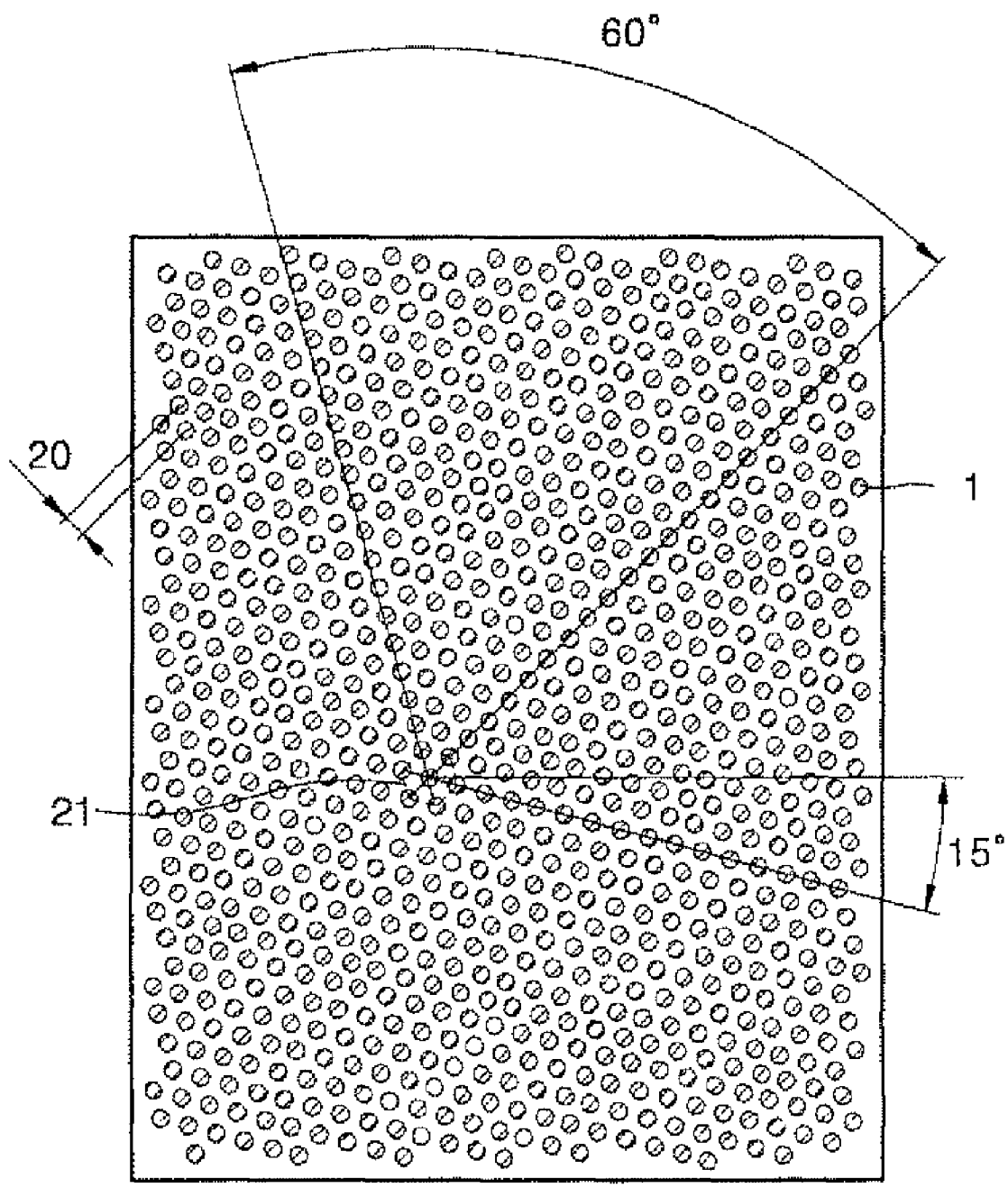
FIG. 13 shows a top view of the pattern applied during the manufacture of TFTs according to an embodiment of the present invention.

FIG. 6C shows a top view of a section of a substrate 5 comprising two TFTs having source electrodes 2, drain electrodes 2a, and gate electrodes 4 after the deposition of the semiconducting element 1 and channel 11 (not labeled). FIG. 6D shows an enlarged view of section A of FIG. 6C. The substrate 5 now comprises a plurality of circular shaped patterned semiconductor elements 1 which result in the hexagonal pattern 21. A diameter 18 of an applied semiconducting element 1 is larger than a distance 16 between the drain electrode 2a and the source electrode 2 in a TFT. Due to the above described conditions there always exist semiconducting elements 1 which are coupled with drain electrode 2a and the source electrode 2 of a single TFT. Such a deposition results in the non-continuous channel 11 between the drain electrode 2a and the source electrode 2. However, even though the channel 11 is non-continuous, the deposition of semiconducting element 1 and channel 11 is sufficient for the operation of the TFTs. In particular, as described above, when the semiconducting elements 1 are arranged in the hexagon-shape pattern, the hexagons 21 are tilted by 15° with respect to the longitudinal axes of drain electrodes and source electrodes. The hexagon-shape arrangement of the pattern leads to a very homogeneous distribution of the semiconducting elements 1 for all horizontal and vertical lines of the substrate. The pattern 21 is shown in FIG. 13. Since the semiconducting elements 1 are arranged in the hexagon-shape pattern, lines connecting the adjacent semiconducting elements 1 and the center of the hexagon-shape pattern form 60° as illustrated in FIG. 13.

Alternatively, the pattern 21 can be applied by ink jet printing instead of using the shadow mask 13.

Figure 7:
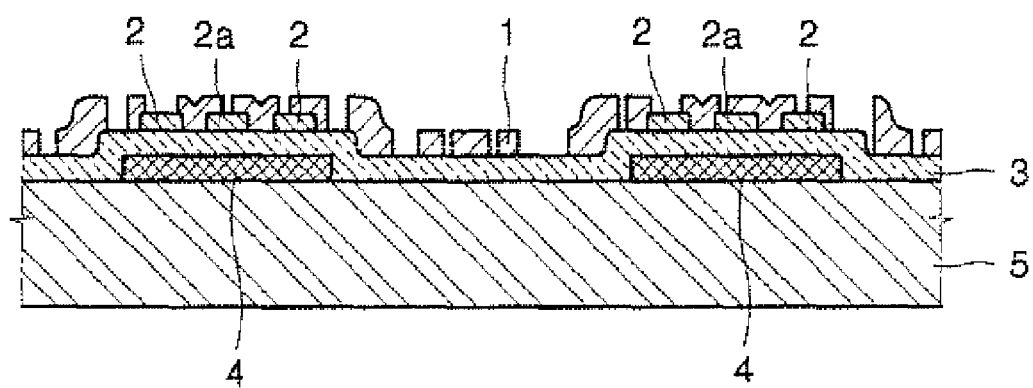
FIG. 7 shows a cross-sectional view taken along the lines VII-VII of FIG. 6D.
Figure 8:
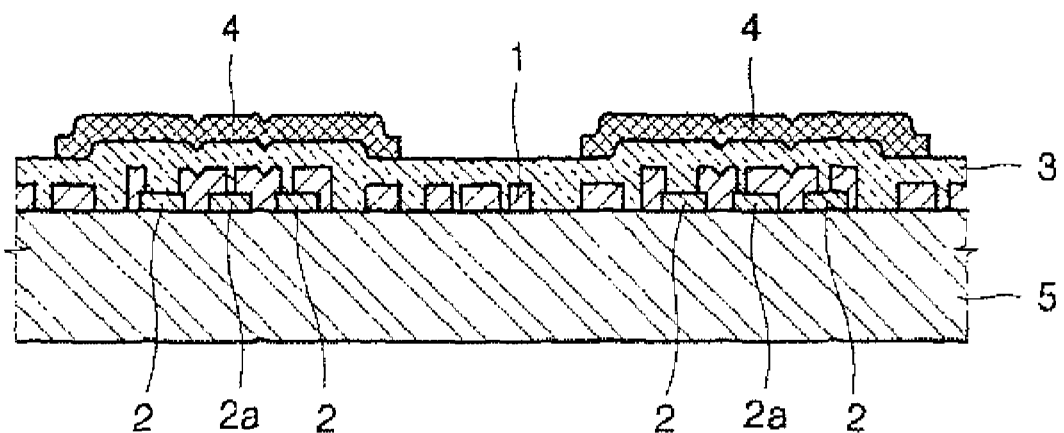
FIG. 8 shows a cross-sectional view of a modified TFT shown in FIG. 7.

FIG. 7 shows a cross-sectional view taken along the lines VII-VII of FIG. 6D and illustrates a bottom gate structure. The present invention is not necessarily restricted thereto but can be identically applied to a top gate structure, as shown in FIG. 8, where a gate insulation film 3 and a gate electrode 4 are disposed on the drain electrode 2a and the source electrode 2.

The main advantage to this method is that a precise alignment of the shadow mask 13 or the print head in relation to the substrate 4 and electrodes 2 and 2A of the TFTs is not necessary during fabrication.

Figure 9:
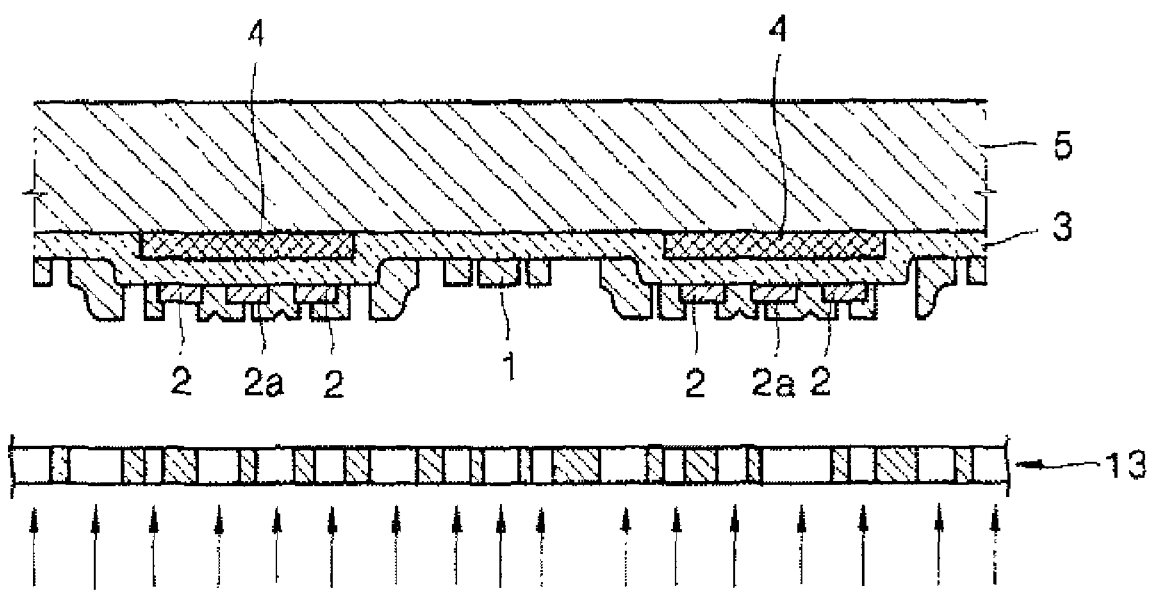
FIG. 9 shows a schematic top view of a semiconducting element forming process through deposition.

The shadow mask 13 as described above forms a plurality of circular shaped semiconducting elements 1 as illustrated in FIG. 9. Due to the aforementioned dimensions of 18 and 19, where the distance 19 is larger than distance 18, there is no common connection between adjacent TFT electrodes or other conductive lines (not shown) via the semiconducting element 1. However in the channel region 11 there is a sufficient quantity of the deposited semiconductor element 1 between the source electrodes 2 and drain electrodes 2a, for example, approximately 50% of the channel width 17. Even though the mask 13 may be shifted by a small distance in any direction, there will be a similar result and sufficient contact between the source electrode 2 and drain electrode 2a.

Figure 10:
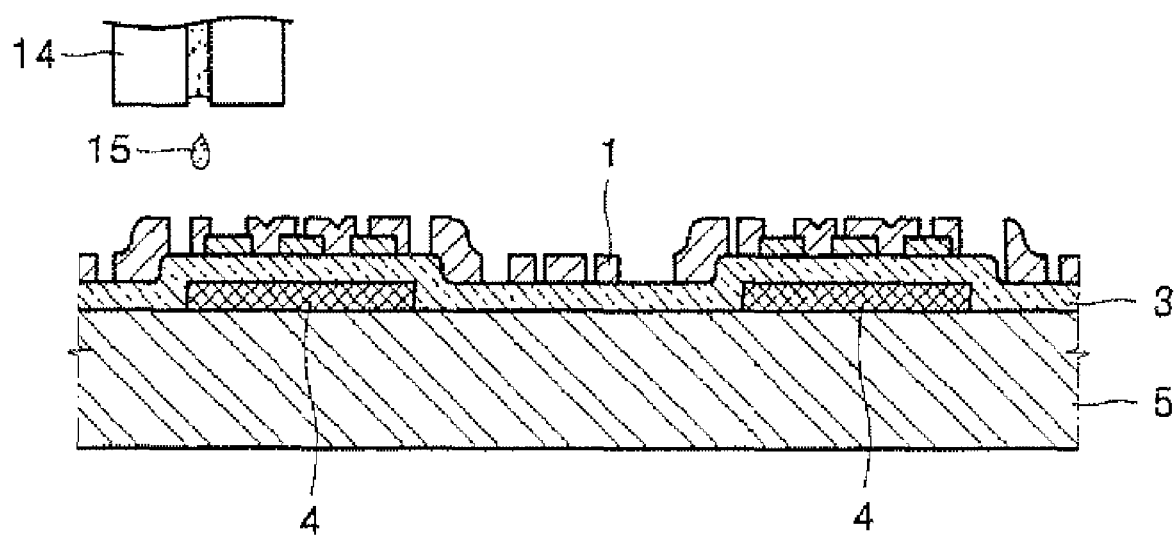
FIG. 10 shows a schematic top view of a semiconducting element forming process through inkjet printing.

The organic semiconductor layer of the OTFT can be formed using a variety of methods, such as inkjet printing technology as shown in FIG. 10. Ink drops 15 are applied though a print head 14 as illustrated in FIG. 10, to form a plurality of circular-shaped semiconducting elements 1 as illustrated in FIG. 6C and FIG. 6D. When the deposition of the semiconductor element 1 is carried out by ink jet printing precise alignment of the print head 14 in relation to the substrate 5 may be avoided. Additionally, printing processes for flexible substrates do not require cost intensive local registration during said printing process due to a possible shrinkage of the substrate.

In order to sufficiently connect the drain electrode 2a and the source electrode 2 via the semiconducting elements 1, the maximum dimension 18 of the semiconducting elements 1 may be at least 50% greater than the minimum distance 16 between the drain electrode 2a and the source electrode 2 of one pair. In an exemplary embodiment of the invention the maximum dimension 18 of the semiconducting elements 1 can be 100% greater than the minimum distance 16 between the drain electrode 2a and the source electrode 2 of one pair. To sufficiently separate adjacent TFTs to prevent cross-talk between the adjacent TFTs, the minimum distance 19 between electrodes of adjacent pairs can be at least 200% greater than the minimum distance 16 between the drain electrode 2a and the source electrode 2 of one pair.

The semiconducting elements 1 may be formed of an organic semiconducting element, including pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, oligoacene of naphthalene and its derivatives, alpha-5-thiophene oligothiophene and its derivatives, phthalocyanine—that does not include a metal—and its derivatives, naphthalene tetracarboxylic diimid and its derivatives, and naphthalene tetracarboxylic acid dianhydride and its derivatives, pyromelitic dianhydride and its derivatives, pyromelitic diimide and its derivatives, thiophene-containing conjugated polymer and its derivatives, and fluorene-containing polymer including thiophene and its derivatives.

Figure 11A:
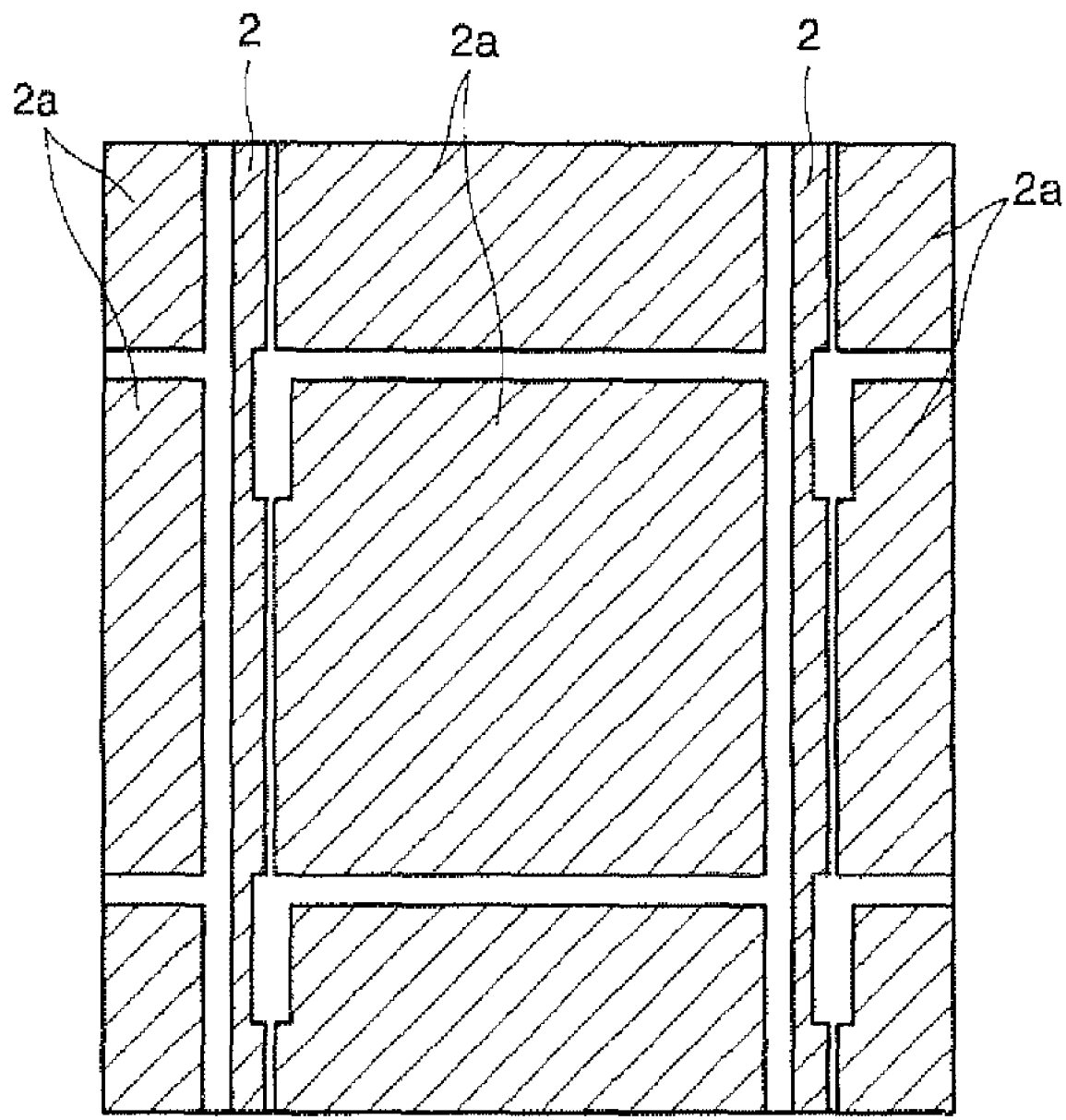
FIG. 11A shows a top view of a section of a substrate comprising a plurality of TFTs having source, drain, and gate electrodes prior to the application of the semiconducting element (channel).
Figure 11B:
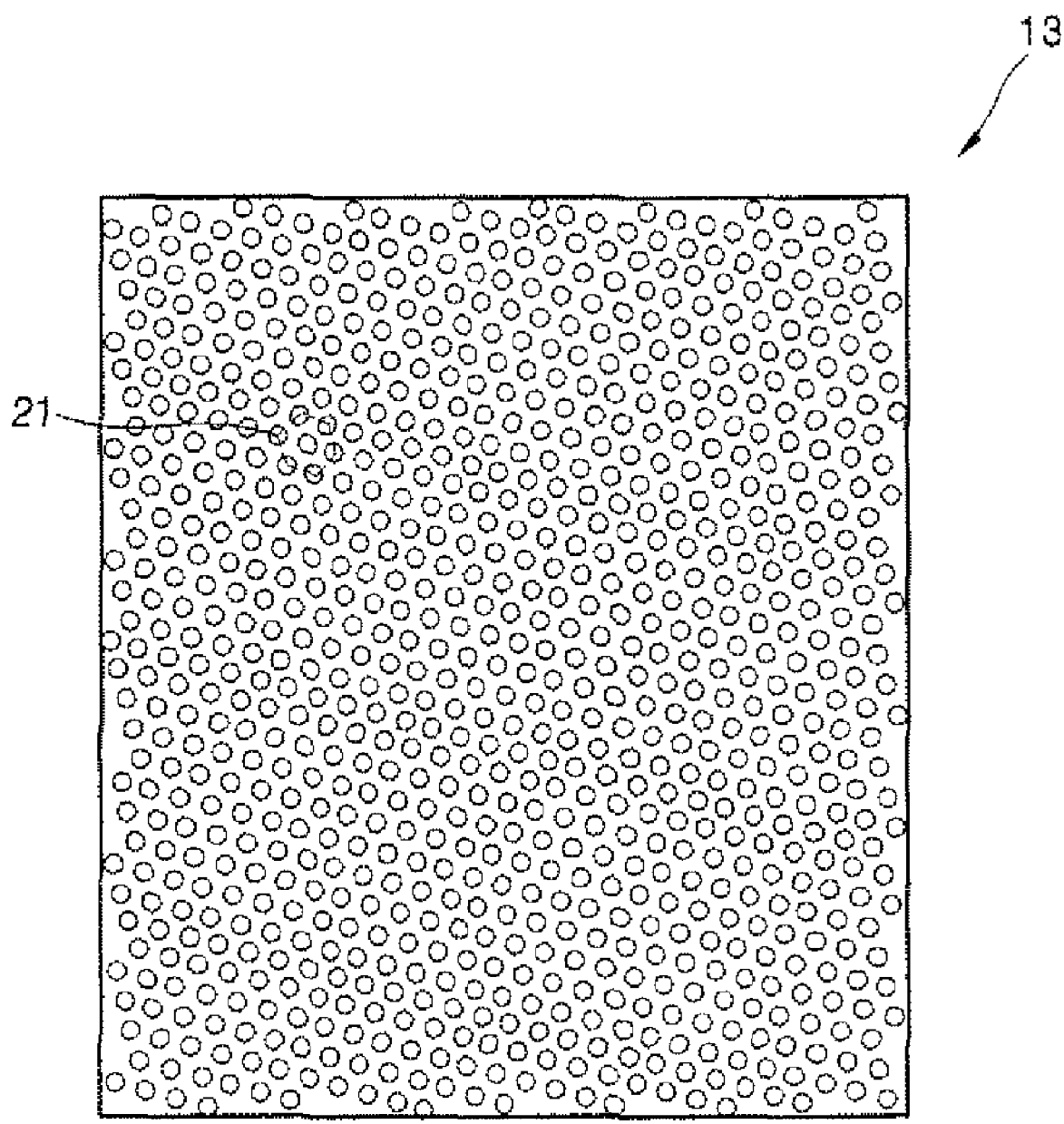
FIG. 11B shows a top view of the shadow mask used for the application of the semiconducting element (channel) according to an embodiment of the present invention.
Figure 11C:
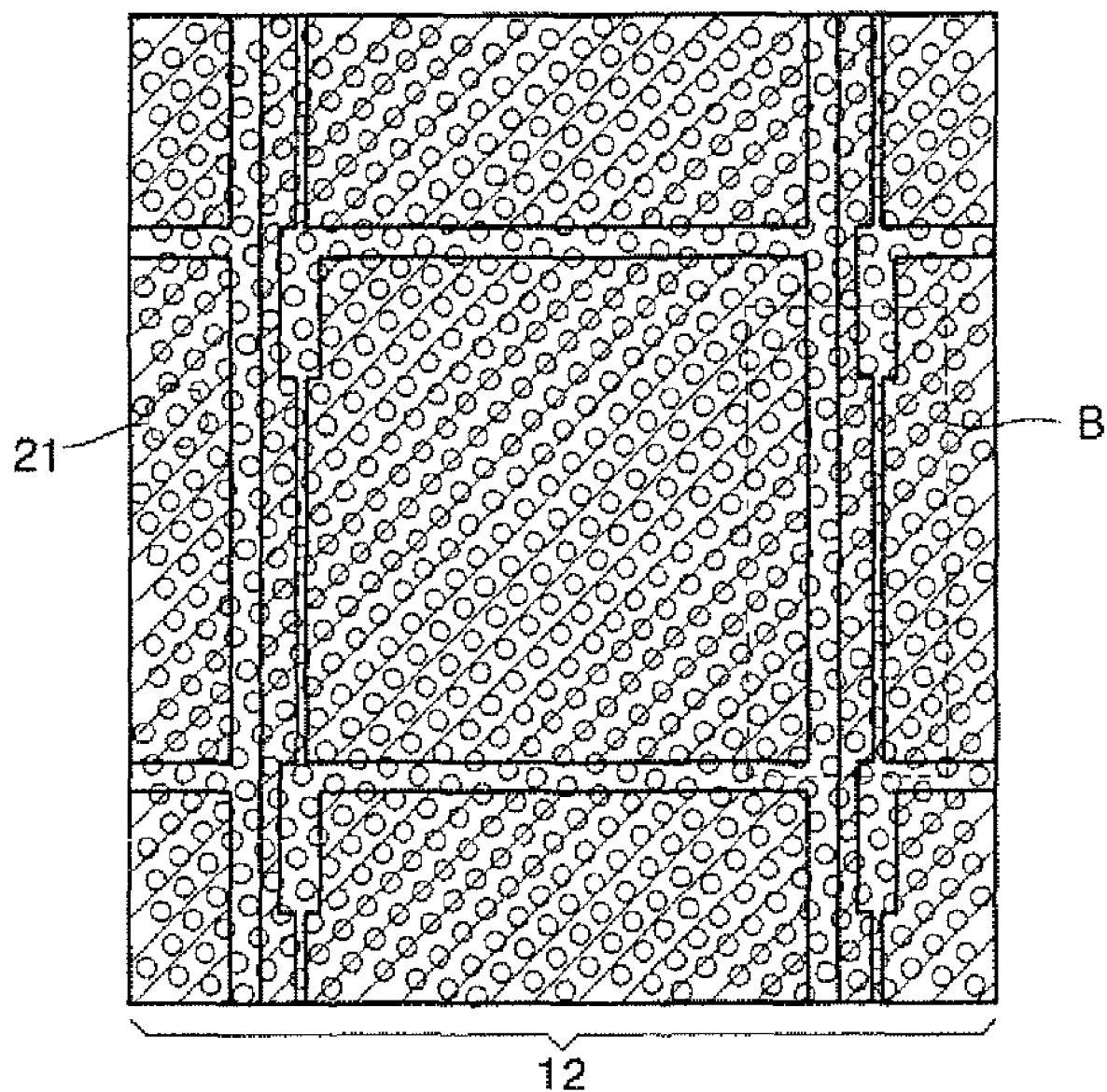
FIG. 11C shows a top view of a section of a substrate comprising a plurality of TFTs having source, drain, and gate electrodes after the application of the semiconducting element (channel).
Figure 11D:
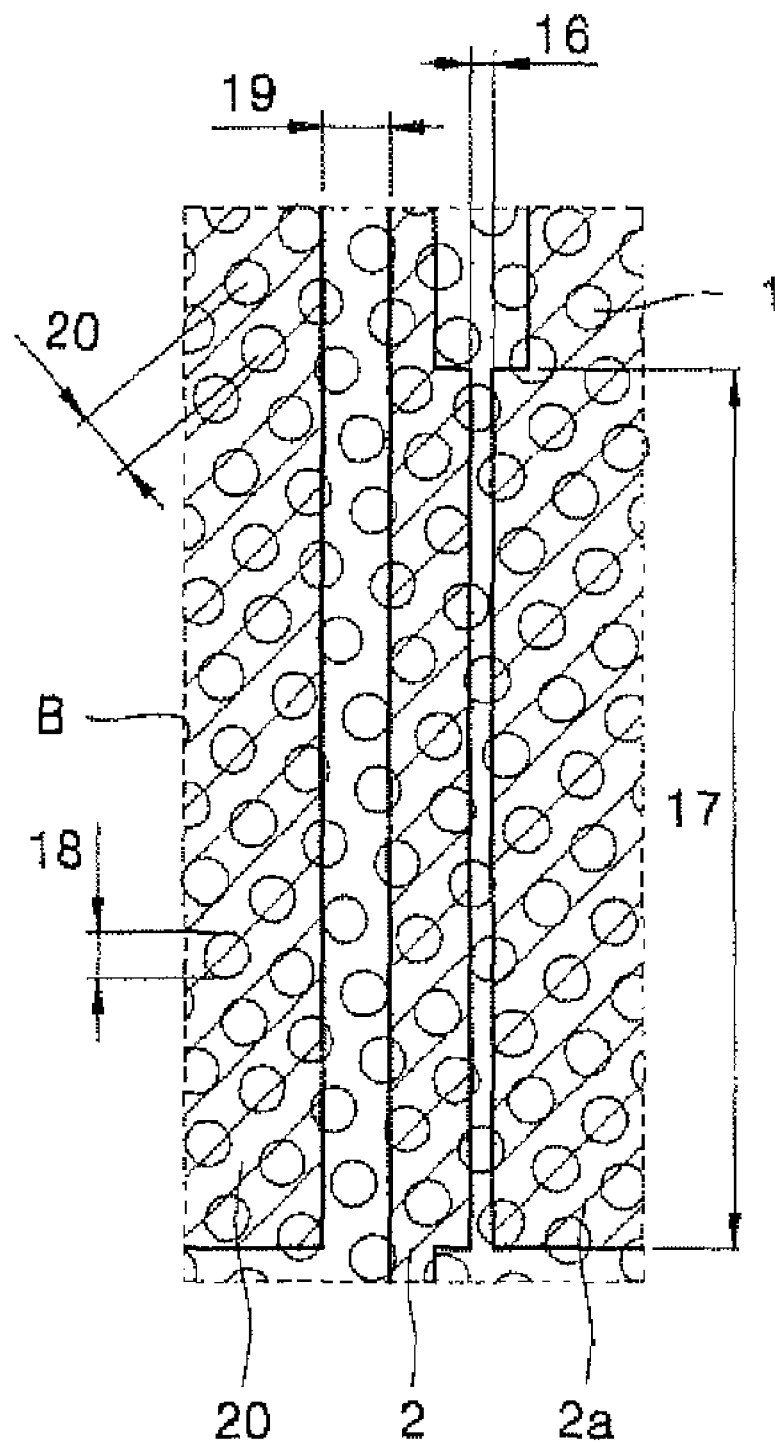
FIG. 11D shows an enlarged view of a section of FIG. 11C.

FIG. 11A shows a top view of a section of a substrate 5 including a plurality of source electrodes 2, drain electrodes 2a, and gate electrodes 4 prior to the application of the semiconducting element 1 and channel 11, the gate electrodes (not shown) are located in the portion of the substrate between each pair of source electrodes 2 and drain electrodes 2a. A semiconductor layer for the channel is patterned using a new shadow mask 13 design, shown in FIG. 11B, without the need of precise alignment. As it can be seen in FIG. 11C, there are many circular shaped patterned semiconductor elements 1 forming a pattern 21 in the final OTFT circuit. There is no unwanted connection path between the source electrodes 2 and drain electrodes 2a of adjacent TFTs or other conductive lines because a distance 19 is larger than the dimension 18 as shown in FIG. 11D, which shows an enlarged view of section B of FIG. 11C. But in the channel region, which has a length 16 between source electrode 2 and drain electrode 2a and a width 17, there is a sufficient amount of the semiconductor element 1 between the source electrode 2 and the drain electrode 2a. Approximately 50% of the channel can be filled with semiconductor element 1 without precise alignment of the mask and substrate prior to depositing the semiconductor elements 1. Thus there is no need to use a cost-intensive, complicated mask alignment to fabricate OTFT circuits. This new TFT device structure may enable easier fabrication on glass or plastic substrates and the use of such devices in flat panel display applications or other electronic circuits such as RFID tags or sensors. Top and bottom gate architectures are possible.

As can be seen from FIG. 6D and FIG. 11D, a center-to-center distance 20 (N) of neighbouring semiconductor elements 1 is preferably larger than the maximum diameter 18 (D) of the semiconducting elements. Furthermore the channel width 17 (W) of the thin film transistor is preferably larger than the center-to-center distance 20 (N) of the neighbouring semiconductor elements 1.

The OTFT as described above may be included in a flat panel display apparatus such as liquid crystal display (LCD) or organic electroluminescent (EL) display.

Figure 14:
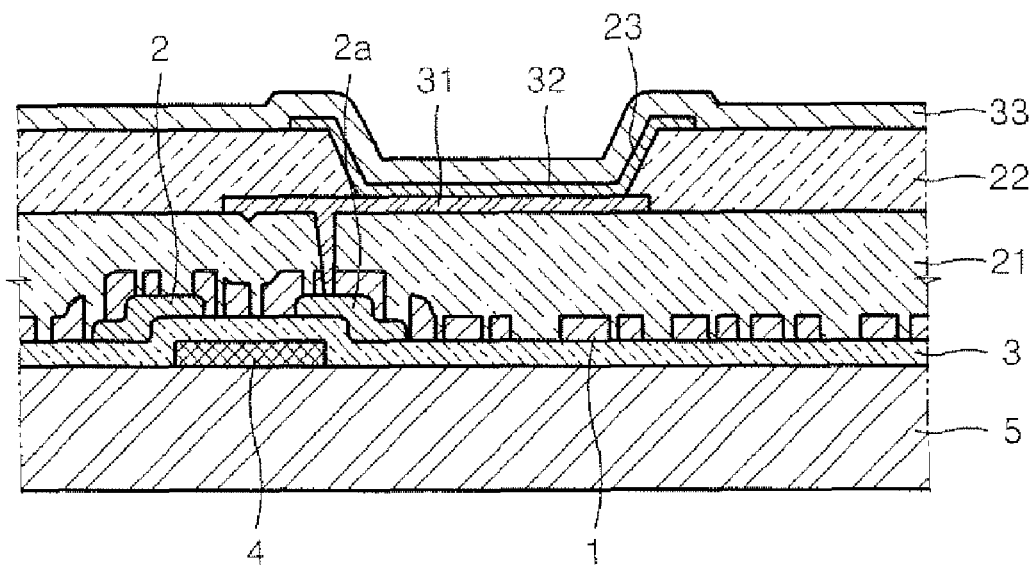
FIG. 14 shows a cross-sectional view of a flat panel display apparatus comprising a TFT according to an embodiment of the present invention.

FIG. 14 shows the TFT included in the organic EL display. FIG. 14 illustrates a sub-pixel of an OTFT where each sub-pixel includes an organic light emitting diode (OLED) as a self light-emitting device and at least one TFT. Although not shown, each sub-pixel further can include a capacitor.

The organic EL display has a variety of pixel patterns according to light-emitting colors of OLED, and can have red, green, and blue pixels.

Each red, green, and blue sub-pixel can have a TFT structure as illustrated in FIG. 14 and can include an OLED that is a self light-emitting device. The OTFT can be replaced with the aforementioned TFT. However, the sub-pixel is not necessarily restricted thereto but can have diverse TFT structures.

Figure 15:
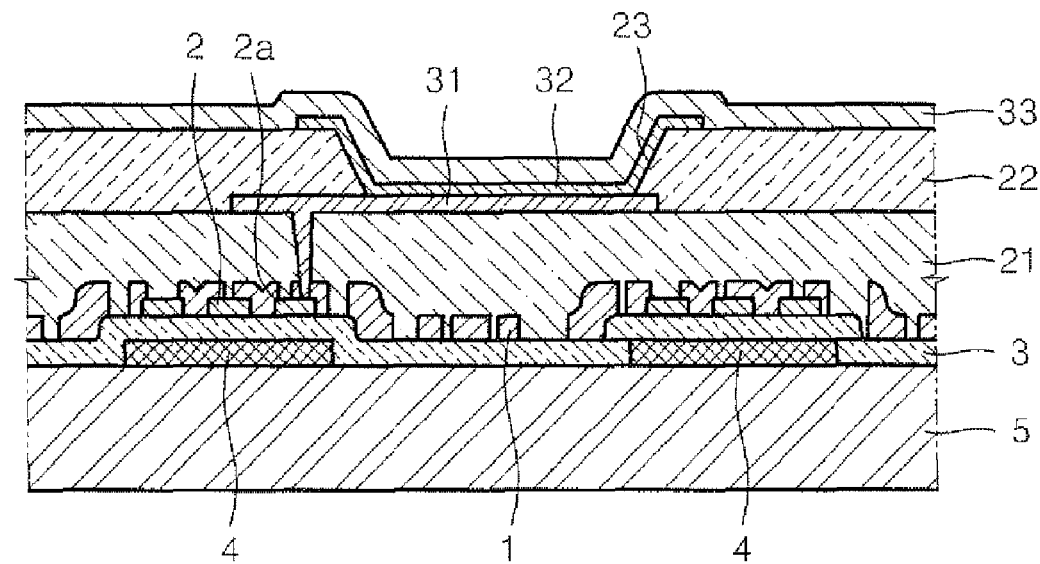
FIG. 15 shows a cross-sectional view of a flat panel display apparatus comprising a TFT according to an embodiment of the present invention.

As FIG. 15 shows, the aforementioned TFT can be disposed on a substrate 5 and can have a double channel structure where a source electrode is double formed, whereas the TFT shown in FIG. 14 has a single channel structure.

The TFT can include a predetermined pattern of a gate electrode 4, a gate insulation film 3 covering the gate electrode 4, a source electrode 2 and a drain electrode 2A disposed on the gate insulation film 3, and semiconducting elements 1 that contact both the source electrode 2 and the drain electrode 2A.

A passivation film 21 is formed to cover the TFT after the formation of the semiconducting elements 1. The passivation film 21 may be formed of an organic substance, an inorganic substance, or a mixture of organic/inorganic substances in a single- or multi-layered structure.

A pixel electrode 31, which is an electrode of an OLED, is formed on the passivation film 21 and a pixel definition film 22 is formed on the pixel electrode 31. After a predetermined opening 23 is formed in the pixel definition film 22, an OLE film 32 of the OLED is formed on the pixel definition film 22.

The OLED, which can emit red, green, or blue light as current flows and to display predetermined image information, comprises the pixel electrode 31 connected to one of the source electrode 2 and the drain electrode 2a of the TFT, a facing electrode 33 for completely covering the pixel, and an organic light-emitting film 32 interposed between the pixel electrode 31 and the facing electrode 33.

The organic light-emitting film 32 insulates the pixel electrode 31 and the facing electrode 33 from each other and emits light when a potential difference is generated between the pixel electrode 31 and facing electrode 33.

The organic light-emitting film 32 may be formed of a low molecular weight organic material or a high molecular weight organic material. When the organic light-emitting film 32 is formed of a low molecular weight organic material, it may include a plurality of layers such as a single hole injection layer (HIL), a single hole transport layer (HTL), a single emission layer (EML), a single electron transport layer (ETL), and a single electron injection layer (EIL). Alternatively, the organic light-emitting film 32 may be a single layer that performs all functions of an HIL, an HTL, an EML, an ETL, and an EIL. Examples of available low molecular weight organic materials include copper phthalocyanine (CuPc); N, N'-Di(naphthalene-1-yl)-N,N'-diphenyl-benzidine (NPB); and tris-8-hydroxyquinoline aluminum (Alq3). These low molecular weight organic materials may be formed using a vacuum deposition method.

When the intermediate layer is formed of a high molecular weight organic material, it may include an HTL and an EML. The HTL can be formed of PEDOT, and the EML can be formed of a polymer organic material, such as a poly-phenylenevinylene-based (PPV-based) material or a polyfluorene-based material, using a screen printing method or an inkjet printing method.

The organic light-emitting film 32 is not necessarily restricted thereto but various embodiments may be applied to the organic light-emitting film 32.

The pixel electrode 31 serves as an anode, and the facing electrode 33 serves as a cathode. Further, the polarities of the pixel and facing electrodes 31 and 33 may be reversed.

The present invention is not necessarily restricted to the above structure but may be applied to various structures of OLEDs. For example, a lower alignment film (not shown) for covering the pixel electrode 31 can be formed in LCDs, thereby completing the manufacture of a lower substrate of LCDs.

The TFT according to the present invention can be embedded in each sub-pixel and in a driver circuit (not shown) or other electronic circuits in which an image is not displayed.

The substrate 5 of the OLED can be formed of a flexible substrate, for example, a plastic substrate, a metal substrate, or a glass substrate.

As described above, the organic thin film transistor, a method of producing the same, and a shadow mask used in the method according to the present invention can prevent cross talk between adjacent TFTs without precise alignment of substrates of the shadow mask or a print head.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A substrate, comprising:
    a plurality of pairs of drain electrodes and source electrodes for thin film transistors; and
    a plurality of semiconducting elements arranged in a pattern,
    wherein a first distance between a drain electrode and a source electrode of one pair is less than a second distance, the second distance being a distance between one electrode of the one pair and a closest electrode of an adjacent pair, wherein a width of the semiconducting elements is less than the second distance and equal to or greater than the first distance, wherein a first number of the semiconducting elements contacts one of the drain electrodes and one of the source electrodes, and a second number of the semiconducting elements does not contact one of the drain electrodes and one of the source electrodes, and wherein each thin film transistor comprises a plurality of the first number of semiconductor elements.

2. The substrate of claim 1, wherein a drain electrode and a source electrode comprise a rectangular shape with the longitudinal axes of the drain electrode and the source electrode of one pair arranged substantially parallel to each other.

3. The substrate of claim 1, wherein the width of the semiconducting elements is at least 50% greater than the first distance.

4. The substrate of claim 1, wherein the width of the semiconducting elements is at least 100% greater than the first distance.

5. The substrate of claim 1, wherein the second distance is at least 200% greater than the first distance.

6. The substrate of claim 1, wherein the semiconducting elements have a circular shape.

7. The substrate of claim 1, wherein six semiconducting elements are arranged in a shape substantially equivalent to a hexagon.

8. The substrate of claim 7, wherein the hexagon is tilted 15° with respect to the longitudinal axis of the drain electrode or the source electrode.

9. The substrate of claim 1, wherein the semiconducting element comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, oligoacene of naphthalene and its derivatives, alpha-5-thiophene oligothiophene and its derivatives, phthalocyanine—not including a metal—and its derivatives, naphthalene tetracarboxylic diimid and its derivatives, and naphthalene tetracarboxylic acid dianhydride and its derivatives, pyromelitic dianhydride and its derivatives, pyromelitic diimide and its derivatives, thiophene-containing conjugated polymer and its derivatives, and fluorene-containing polymer including thiophene and its derivatives.

10. A flat panel display apparatus, comprising:
the substrate of claim 1; and
a display element electrically coupled with at least one pair of a drain electrode and a source electrode on the substrate.

11. The flat panel display apparatus of claim 10, wherein the display element comprises:
a pixel electrode;
a facing electrode facing the pixel electrode; and
an organic light emitting film interposed between the pixel electrode and the facing electrode.

12. A substrate, comprising a plurality of thin film transistors, each thin film transistor comprising:
a drain electrode;
a source electrode positioned a first distance from the drain electrode;
a non-continuous channel positioned between each drain electrode and each source electrode and formed by a first group of a plurality of semiconducting elements arranged in a regular pattern, wherein a second group of the plurality of semiconducting elements arranged in the regular pattern does not form the channel; and
a gate electrode,
wherein the first distance is less than a second distance, the second distance being a distance between one electrode of one thin film transistor and a closest electrode of an adjacent thin film transistor, and a width of the semiconducting elements is less than the second distance but equal to or greater than the first distance.

13. The substrate of claim 10, wherein a drain electrode and a source electrode comprise a rectangular shape with the longitudinal axes of the drain electrode and the source electrode of one pair arranged substantially parallel to each other.

14. The substrate of claim 10, wherein the width of the semiconducting elements is at least 50% greater than the first distance.

15. The substrate of claim 12, wherein the width of the semiconducting elements is at least 100% greater than the first distance.

16. The substrate of claim 12, wherein the second distance is at least 200% greater than the first distance.

17. The substrate of claim 12, wherein the semiconducting elements have a circular shape.

18. The substrate of claim 12, wherein six semiconducting elements are arranged in a shape substantially equivalent to a hexagon.

19. The substrate of claim 18, wherein the hexagon is tilted 15° with respect to the longitudinal axis of the drain electrode or the source electrode.

20. The substrate of claim 12, wherein the semiconducting element comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, oligoacene of naphthalene and its derivatives, alpha-5-thiophene oligothiophene and its derivatives, phthalocyanine—not including a metal—and its derivatives, naphthalene tetracarboxylic diimid and its derivatives, and naphthalene tetracarboxylic acid dianhydride and its derivatives, pyromelitic dianhydride and its derivatives, pyromelitic diimide and its derivatives, thiophene-containing conjugated polymer and its derivatives, and fluorene-containing polymer including thiophene and its derivatives.

21. A flat panel display apparatus, comprising:
the substrate of claim 12; and
a display element electrically coupled with at least one pair of a drain electrode and a source electrode on the substrate.

22. The flat panel display apparatus of claim 21, wherein the display element comprises:
a pixel electrode;
a facing electrode facing the pixel electrode; and
an organic light emitting film interposed between the pixel electrode and the facing electrode.

* * * * *